United States Patent
Tsai et al.

(10) Patent No.: US 8,351,288 B2
(45) Date of Patent: Jan. 8, 2013

(54) FLASH STORAGE DEVICE AND DATA PROTECTION METHOD THEREOF

(75) Inventors: Song-Feng Tsai, Hsinchu (TW); Wen-Tsung Yang, Hsinchu (TW); Jen-Yu Hsu, Hsinchu (TW)

(73) Assignee: Lite-On It Corp., Taipei (TW)

( * ) Notice: Subject to any disclaimer, the term of this patent is extended or adjusted under 35 U.S.C. 154(b) by 246 days.

(21) Appl. No.: 12/976,407

(22) Filed: Dec. 22, 2010

(65) Prior Publication Data

US 2011/0185224 A1    Jul. 28, 2011

(30) Foreign Application Priority Data

Jan. 28, 2010 (CN) .......................... 2010 1 0105760

(51) Int. Cl.
*G11C 7/04* (2006.01)

(52) U.S. Cl. .............. 365/211; 365/189.17; 365/189.07; 365/229

(58) Field of Classification Search ................... 365/211, 365/189.17, 189.07, 229
See application file for complete search history.

(56) References Cited

U.S. PATENT DOCUMENTS

| | | | |
|---|---|---|---|
| 7,184,313 B2* | 2/2007 | Betser et al. | 365/185.24 |
| 7,733,720 B2* | 6/2010 | Joshi et al. | 365/201 |
| 2006/0285408 A1* | 12/2006 | Betser et al. | 365/212 |
| 2010/0277990 A1* | 11/2010 | Kenkare et al. | 365/189.011 |
| 2011/0047319 A1* | 2/2011 | Jeon et al. | 711/103 |
| 2011/0110141 A1* | 5/2011 | Tran | 365/148 |
| 2011/0216592 A1* | 9/2011 | Nagashima | 365/185.11 |

* cited by examiner

*Primary Examiner* — Tuan T. Nguyen
(74) *Attorney, Agent, or Firm* — WPAT PC; Justin King

(57) ABSTRACT

A flash storage device comprises: a memory module, for storing data; a control unit, electrically connected to the memory module, for accessing the data in the memory module; and a detecting unit, electrically connected to the control unit, for passing a temperature detecting result to the control unit, and the control unit determining whether a data protection operation is activated according to the temperature detecting result.

14 Claims, 1 Drawing Sheet

FLASH STORAGE DEVICE AND DATA PROTECTION METHOD THEREOF

This application claims the benefit of People's Republic of China application Serial No. 201010105760.0, filed Jan. 28, 2010, the subject matter of which is incorporated herein by reference.

FIELD OF THE INVENTION

The present invention relates to a flash storage device and data protection method thereof, and more particularly to a flash storage device and data protection method thereof activating data protection according to a temperature detecting result.

BACKGROUND OF THE INVENTION

Flash memories are non-volatile semiconductor memory devices used for data storage by controlling electrons staying in the floating gates. The approach of floating gate is used for storing data via the storage of electrons at flash cells, and comprises steps of: connecting the control gate to a high voltage and connecting the drain to a low voltage while programming the flash cells. Due to the voltage difference between the control gate and the drain, the floating gate is capable of maintaining a voltage Vt while the flash cell is being programmed. After removing the high voltage and the low voltage from the control gate and the drain, the floating gates then preserve the electrons.

Due to the characteristics of vibration-proof, low noise and low power consumption, flash storage devices are widely used in recent days. With the development of techniques, the usage of flash memories is more popular. Except being used as a portable data storage media like a thumb drive, a compact flash card (CF card), a secure digital card (SD card), a multi media card (MMC card), nowadays, flash memories are used for solid state drive (herein after, SSD) and intend to replace the conventional hard disks in personal computers.

According to the various circuit combinations, flash memories can be classified into different types like nand-flash memories, nor-flash memories etc. The usage of the nand-flash memories is more popular than the usage of the nor-flash memories in practical application due to the following reasons: First of all, the erasing period of the nand-flash memories is shorter than the nor-flash memories. Secondly, the nand-flash memories have higher storage density. Besides, the number of erasing times of the nand-flash memories is ten times more than the number of erasing times of the nor-flash memories.

Generally speaking, a flash storage device comprises nand-flash memories, and a control chip. Depending on the various implementation techniques, nand-flash memories in the market can be separated into a single-level cell style of flash memory (herein after, SLC flash memory), or a multi-level cell style of flash memory (herein after, MLC flash memory).

Simply specking, the distinct difference between the SLC flash memories and the MLC flash memories is, only one bit of data is stored in each cell (floating gate) of SLC flash memories, while two or more bits of data are stored in each cell (floating gate) of MLC flash memories. In other words, the floating gate of the MLC flash memories has a higher unit capacity for data storage, and this implies that MLC flash memories uses less space for storing the same quantity of data. Although the MLC flash memories have some shortages like: higher error rate for data programming, shorter life, and longer block erasing time, longer page programming time, the MLC flash memories are actually more common in practice due to its advantages of higher data storage density and lower manufacture cost. Hence MLC flash memories are widely used for mass storage application, especially for SSD.

In order to avoid failures occurred while accessing data, it is very common to provide data control or management mechanisms for flash memories access. For example, proceeding bad block management (referred as, BBM) in order to detect and mark trouble blocks in the flash memories and further avoid the usage of such trouble blocks latter on. Another example is providing wear-leveling techniques to keep a record of the eraseing times of each block in the flash memory, and avoid the chances that a host erases only certain blocks as it might shorten the life of the flash storage device. Flash storage device uses error correcting codes (herein after, ECC) for detecting or examining error while programming or reading data. Besides, flash storage device is capable of providing relative control mechanism for speeding up the access speed, or diminishing the data crash problem caused by unstable power supply.

ECC are used for both bit error correction and bit error detection, and ECC can be implemented by different algorithms in practice. For example, Hamming Code, Reed Solomom Code etc. are used in conventional techniques for ECC.

All ECC algorithms have their limitations, that is, once the number of error bits in the flash memory is more than ECC algorithms can detect, ECC is not able to recover the data. This implies that there is a chance to access incorrect data stored in the flash memory.

For example, while accessing a 4k bytes page, two 2k bytes of allocation unit might be used. Besides, an ECC with 64 bytes length might be used for each page. By doing so, the ECC are capable of correcting incorrect data if the number of error bits is no more than 32 bits in the same page.

In other words, once the ECC reach their limitations and not able to correct the content stored in the flash memories, that is, in the previous example, if the number of error bits is more than 32 bits, the ECC are not capable of finding out the incorrect data nor correcting them. This implies that the data stored in the flash memories are damaged, and this is very dangerous for data storage devices. As the functions of ECC are limited, it is important to guarantee the correctness of data stored in flash memories. As for the MLC flash memories, this issue becomes more important as MLC flash memories are wildly used for mass data storage with higher error rate during data accessing.

Moreover, as flash memories use floating gate to store data, it happens the electrons stored at the floating gates are easily missing in a high temperature environment. Besides, in a low temperature environment, electrons are not easily to be injected or pulled off the floating gates. This result in the content of data stored in the flash memories being affected, and this phenomena becomes more often when the process technique is more advanced. In other words, the data stored in the flash memories are affected by the temperature in the surrounding environment, and this might increase the number of error bits. Since the sensitivity to the temperature becomes a serious problem for flash memories nowadays, it might result in that the occasions of ECC not capable of correcting data are more. Therefore, the intention of the present invention is to propose an approach to solve the problem.

SUMMARY OF THE INVENTION

Therefore, the present invention provides a flash storage device and data protection method thereof, through the use of a temperature detecting sensing unit, the flash storage device and data protection method thereof are able to preserve data more effectively.

The present invention provides a flash storage device comprising: a memory module, for storing data; a control unit, electrically connected to the memory module, for accessing data in the memory module; and a detecting unit, electrically connected to the control unit, for passing a temperature detecting result to the control unit, and the control unit determines whether a data protection operation is activated according to the temperature detecting result.

The present invention provides a flash storage device comprising: a memory module for storing data; and a control unit, electrically connected to the memory module, for accessing data in the memory module, wherein the control unit fetches a section data from a source section in the memory module and proceeds an error examination when the flash storage device is in a standby mode, and if the result of the error examination matches a predetermined condition, the section data is corrected, and the corrected section data is stored to a target section in the memory module.

The present invention provides a data protection method applied to a flash storage device, the data protection method comprising steps of: obtaining a temperature detection result; and activating a data protection operation if the temperature detection result is over a temperature threshold.

The present invention provides a data protecting method applied to a flash storage device, the data protecting method comprising steps of: fetching a section data from a source section and proceeding an error examination when the flash storage device is in a standby mode; and performing an error correction and storing the corrected section data to a target section if the result of the error examination matches a predetermined condition.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
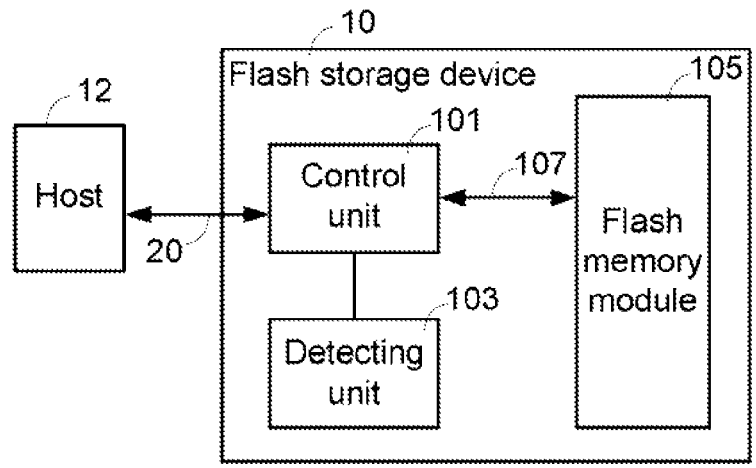
FIG. 1 is a block diagram illustrating a flash storage device proposed in the present invention.

FIG. 1 is a block diagram illustrating a flash storage device proposed in the present invention. The flash storage device 10 comprises: a control unit 101, a detecting unit 103, and a flash memory module 105. According to the approaches of data reading, writing, and erasing, the flash memory module 105 is divided into a plurality number of blocks, wherein each block is further divided as a plurality number of pages. These blocks and pages are used as basic units for data erasing, fetching, and programming. Via a host data bus 20, a host 12 is able to access the data stored in the flash storage device 10.

Due to the inherent limit of flash memories, the erasing and programming times of a certain block is limited. Therefore, the control unit 101 has to control the usage status of each block in the flash memories for avoiding the situation that too many error bits are generated and causing further damages. This is the reason why does the control unit 101 provide the management functions like BBM, wear-leveling, and ECC for the flash memory module 105. The present invention provides a method based on the conception of ECC, for managing the data stored in the flash memory module 105, in order to make sure the data stored in the flash memory module 105 is well protected.

Generally speaking, the control unit 101 includes an ECC unit, and the ECC unit is capable of generating an ECC code for a written data or detecting an error for a read data in response to the ECC code. When the host 12 sends a writing command through the control unit 101 to store data, the data and the ECC code generated by the control unit 101 are transmitted to the flash memory module 105 through an internal data bus 107. Furthermore, when the host sends a reading command through the control unit 101 to read data stored in the flash memory module 105, the flash memory module 105 outputs the data and the ECC code together. The data and the ECC code are transmitted to the control unit 101 via the internal bus 107, and the control unit determines the correctness of the data according to the ECC code by the ECC unit.

After determining that the data are correct, the control unit 101 passes the data to the host 12 through the host data bus 10; on the other hand, if the data are incorrect, the ECC unit of the control unit 101 uses ECC algorithms to correct the data, and passes the corrected data to the host 12 through the host data bus 20.

Instead of using the pre-stored ECC to correct the stored data in the flash memory module 105 only when the host 102 fetches data. The present invention proposes another approach to perform a data protection operation while the host 12 is not in communication with the control unit 101. That is, when the host 12 is not accessing the flash storage device 10, let the control unit 101 automatically read the section data stored in a source section from the flash memory module 105, and use the ECC to proceed error examination of the section data, and determine whether to perform error correction and storing the section data. If the result of the error examination matched the predetermined condition, the control unit 101 continues to perform error correction, and stores the corrected section data to the target section in the flash memory module 105. If the error examination does not meet the predetermined condition, this represents the number of error bits is still tolerable, which implies there is no need to perform error correction for the section data, and the section data does not need to be stored to the target section.

The predetermined condition can be defined according to the limitation of the ECC. Follow on the previous example, if the ECC is capable of detecting 32 bits of error bits and correct data with 32 or less error bits, the predetermined condition may be asset as an 8 bits threshold, or any other number less or equal to 32. The purpose of setting the error bits is to use the threshold as a protection mechanism. In other words, before the number of error bits reaches the limitation of the ECC, the section data have been modified and stored to another section (the target section).

Alternately speaking, according to the data protection operation proposed in the present invention, the control unit 101 automatically reads the section data and confirms the number of error bit. If the section data being read with more error bits than the predetermined error bit threshold, the ECC algorithms are performed to correct the section data from the source section, and the corrected section data are stored in the target section. In the case that the number of error bits is within the error bit threshold, the control unit 101 leaves the section data as it is.

It should be noticed that, the error bit threshold is dynamically defined according to the system requirement. For example, use as small number for the error bit threshold for a flash memory device 10 with a larger storage space; or dynamically change the value of the error bit threshold for the same flash storage device 10 in different occasions.

Besides using the ECC to automatically activate the data protection operation, the present invention proposes another approach to activate the data protection operation, that is, according to the temperature detecting result. Rather than only use ECC for data protection, the present invention also provides other approaches for data protection operation.

Comparing to the cases in the room temperature, the flash memories lose more electrons at high temperature, and the electrons are not easily to be injected or pulled off the floating gate at low temperature, which means the data stored in the flash memories are not stable at high temperature or lower temperature. To avoid such case, the present invention proposes an approach to use a detecting unit 104 for passing the temperature detecting result to the control unit 101, wherein the control unit 101 is electrically connected to the detecting unit 101. Later, the control unit 101 uses the temperature detecting result to determine whether to activate a data protection operation or not. In other words, the control unit 101 will compare the temperature detecting result and a temperature threshold, and perform different operations according to the different comparison results. If the temperature detecting result is over the temperature threshold, that is, either the temperature detecting result is greater than a predetermined temperature upper bound, or less than a predetermined temperature lower bound, then activate the data protection operation. If the temperature detecting result is within the temperature threshold, then the control unit 101 activates only common control operation for the flash storage device.

When the control unit 101 stores the section data to a source section in the flash memory module 105 in respond to the control of the host 12, the control unit 101 will activate data protection operation if the temperature sensing result is higher than the temperature upper bound or lower than the temperature lower bound. Besides, once the result of the error examination matches the predetermined condition, that is, the number of error bits is equal to the error bit threshold, then the control unit 101 continues to correct the section data, and store the corrected section data to a target section in the flash memory module 105.

Similarly, in order to avoid the problem that data stored in the flash memory are easily affected at high temperature or low temperature, the present invention further proposes the approach to activate different data protection operation according to the temperature detecting result.

Figure 2:
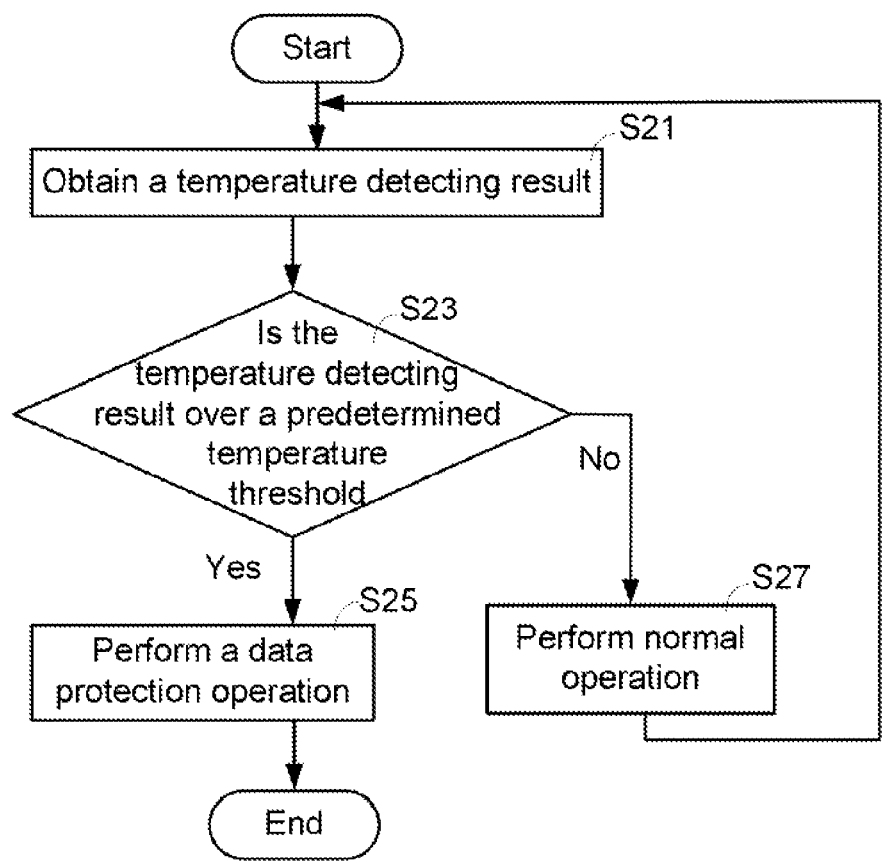
FIG. 2 is a flow chart illustrating the data protection method proposed in the present invention, wherein the data protection method is applied to a flash storage device.

FIG. 2 is a flow chart illustrating the data protection method proposed in the present invention, wherein the data protection method is applied to a flash storage device. First of all, obtaining a temperature detection result (Step S21); second, comparing the temperature detecting result to a predetermined temperature threshold and determining whether the temperature detecting result is over the predetermined temperature threshold.

If the comparison result is negative, the temperature detecting result is within the predetermined temperature threshold, a control operation belongs to a common flash storage device is performed (Step S27). On the other hand, if the comparison result is positive, which means the temperature detecting result is either greater than an upper bound or lower than a lower bound, a data protection operation will be activated.

The data protection in the step S25 can be implemented in different approach, for example:

As for another approach provided in this invention, the data protection operation is applied to the process when the control unit 101 is storing data to the flash memory. While storing data to the flash memory module 104, if the temperature detecting result is higher than the predetermined temperature upper bound or lower than the predetermined temperature lower bound, the control unit 101 raises the driving current in the internal data bus 107. In this embodiment, the data protection operation is achieved by raising the driving current of the internal data bus 107 to make sure that more electrons will be injected into the floating gates.

The other data protection operation proposed in the present invention is, when the control unit 101 is programming the flash memory module 105, if the temperature detecting results detected by the detecting unit 103 is greater than the temperature upper bound, or lower than the temperature lower bound, then extending the duration of programming in order to make sure the procedure of writing data to the flash memory module 104 is correct. In this embodiment, the data protection operation is achieved by extending the duration of the programming procedure.

Besides the approaches that using the temperature detecting result to activate error correction, changing the driving current, or extending the wiring duration for data protection operation, the present invention provides another approach for data protection, that is, performing the data protection operation when the host 12 is not in connection with the flash storage device 10. In short, this approach uses both the temperature detecting result and the error bit threshold as a base, and uses the internal control between the control unit 101, and the flash memory module 104 to prevent the flash memory module 105 from storing incorrect data.

First of all, define a temperature threshold (e.g. define 70 degrees centigrade as a temperature upper bound, or define 5 degrees centigrade as a temperature lower bound), and an error bit threshold (e.g. 30 bits). When the flash storage device 10 is in a standby mode, that is, when the host 12 is not in communication with the control unit 101, the detecting unit 103 is used to detect the temperature of the flash storage device 10. If the temperature of the surrounding environment exceeds the temperature threshold (higher than 70 degrees centigrade or lower than 5 degrees centigrade), the control unit 101 automatically starts to perform data protection operations like examining and protecting the section data stored in the flash memory module 105.

Further speaking, while the host 12 is not accessing the flash storage device 10, which means that the flash storage device 10 is in a standby mode, once the temperature detecting result detected by the detecting unit 103 is over the temperature threshold, the control unit 101 starts to read the content stored in the flash memory module 105 gradually. For each source section, the control unit 101 performs ECC on the section data, and corrects it if the number of error bits of the section data matches the predetermined condition. The predetermined condition means that the error bit of the section data is equal to the error bit threshold. In such case, the content of the section data is corrected and the corrected section data is stored to a target section in the flash memory module 105.

In other words, when the temperature detecting result detected by the detecting unit 103 is within the temperature threshold, the data protection operation will not be activated. If the temperature detecting result exceeds the temperature threshold, the section data will be examined whether the number of the error bits is greater than a predetermined threshold of error bits. If the number of the error bits of the data is less than the predetermined threshold of error bits, the operation of error correction and storing the corrected data to the target section are not performed. If the number of error bits of the data is greater than the predetermined threshold of error bits, the section data are corrected, and the corrected section data are stored to the target section.

Except the approaches mentioned above for data protection operation, other data protection operations may also be adopted, and the temperature thresholds proposed in the above approaches are not necessary to be the same.

In conclusion, the flash memories are very sensitive to the temperature, and this problem becomes more serious when the process techniques are improving. Several approaches are proposed in the present invention, by using a temperature detecting unit 103, the temperature of the surrounding environment is detected and feedback to the control unit 101, so that the control unit 101 can change its policy for accessing the flash memory module according to the temperature detecting result.

It should be noticed that, although the embodiment mentioned above uses MLC flash memories as an example, but the flash memories using floating gates have the same problems that the storing characteristics are affected by temperature. Therefore, same techniques can be applied to other types of flash memories.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A flash storage device comprising:
   a memory module, for storing data;
   a control unit, electrically connected to the memory module, for accessing data in the memory module; and
   a detecting unit, electrically connected to the control unit, for passing a temperature detecting result to the control unit;
   wherein the control unit determines whether a data protection operation is activated according to the temperature detecting result.

2. The flash storage device according to claim 1, wherein the data protection operation is activated if the temperature detecting result is greater than a temperature upper bound, or lower than a temperature lower bound, and the data protection operation comprising steps of:
   the control unit reading a section data from a source section in the memory module and proceeding an error examination; and
   if the error examination result matches a predetermined condition, correcting the section data and storing a corrected section data to a target section in the memory module.

3. The flash storage device according to claim 1, wherein the data protection operation is activated if the temperature detecting result is greater than a temperature upper bound, or lower than a temperature lower bound, and the data protection operation comprising steps of:
   extending the duration of data writing when the control unit is writing data to the memory module.

4. The flash storage device according to claim 1, wherein the data protection operation is activated if the temperature detecting result is greater than a temperature upper bound, or lower than a temperature lower bound, and the data protection operation comprising steps of:
   changing the driving current while writing data to the memory module.

5. The flash storage device according to claim 1, wherein the data protection operation is activated if the temperature detecting result is greater than a temperature upper bound, or lower than a temperature lower bound, and the data protection operation comprising steps of:
   after the control unit writing a section data to a source section in the memory module, the control unit reading the section data and proceeding an error examination, and if the error examination matches a predetermined condition, correcting the section data and storing a corrected section data to a target section.

6. A flash storage device comprising:
   a memory module for storing data; and
   a control unit, electrically connected to the memory module, for accessing data in the memory module,
   wherein the control unit fetches a section data from a source section in the memory module and proceeds an error examination when the flash storage device is in a standby mode, and if the result of the error examination matches a predetermined condition, the section data is corrected, and the corrected section data is stored to a target section in the memory module.

7. A data protection method applied to a flash storage device, the data protection method comprising steps of:
   obtaining a temperature detection result; and
   activating a data protection operation if the temperature detection result is over a temperature threshold.

8. The data protection method according to claim 7, wherein the data protection operation comprising steps of:
   fetching a section data from a source section when the flash storage device is in a standby mode;
   performing an error examination for the section data; and
   performing an error correction for the section data and storing the corrected section data to a target section if the error examination matches a predetermined condition.

9. The data protection method according to claim 7, wherein the data protection operation comprising steps of:
   extending the duration of storing when the flash storage device is storing data.

10. The data protection method according to claim 7, wherein the data protection operation comprising steps of:
    changing the driving current when storing data to the flash storage device.

11. The data protection method according to claim 7, wherein the data protection operation comprising steps of:
    fetching the section data from a source section and proceeding an error examination after the section data is stored to the source section; and
    performing an error correction for the section data and storing the corrected section data to a target section when the result of the error examination matches a predetermined condition.

12. The data protection method according to claim 7, wherein the temperature threshold is an upper bound, and over the temperature threshold means the temperature detecting result is greater than the upper bound.

13. The data protection method according to claim 7, wherein the temperature threshold is a lower bond, and over the temperature threshold means the temperature detecting result is lower than the lower bond.

14. A data protecting method applied to a flash storage device, the data protecting method comprising steps of:
    fetching a section data from a source section and proceeding an error examination when the flash storage device is in a standby mode; and
    performing an error correction and storing the corrected section data to a target section if the result of the error examination matches a predetermined condition.

* * * * *